United States Patent
Defrance et al.

(10) Patent No.: US 8,054,859 B2
(45) Date of Patent: Nov. 8, 2011

(54) PRECESION/SPEED COMPROMISE OF A SYNCHRONIZATION SIGNAL RECEPTION DEVICE

(75) Inventors: Serge Defrance, Rennes (FR); Thierry Tapie, Rennes (FR); Ingrid Autier, Domloup (FR)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/452,051

(22) PCT Filed: Jun. 6, 2008

(86) PCT No.: PCT/EP2008/057097
§ 371 (c)(1),
(2), (4) Date: Dec. 14, 2009

(87) PCT Pub. No.: WO2008/151998
PCT Pub. Date: Dec. 18, 2008

(65) Prior Publication Data
US 2010/0135333 A1    Jun. 3, 2010

(30) Foreign Application Priority Data
Jun. 12, 2007 (FR) .................................. 07 55689

(51) Int. Cl.
*H04J 3/06* (2006.01)
(52) U.S. Cl. ........ 370/503; 370/350; 348/500; 713/375; 713/400
(58) Field of Classification Search .................. 370/350, 370/503–520; 348/500–551; 713/375, 400, 713/401
See application file for complete search history.

(56) References Cited

U.S. PATENT DOCUMENTS

| 7,688,059 B2 * | 3/2010 | Fujiyama et al. ........... 324/76.68 |
| 2004/0257469 A1 * | 12/2004 | Compton et al. ............. 348/500 |
| 2005/0151595 A1 * | 7/2005 | Pratt et al. ....................... 331/16 |
| 2005/0168274 A1 * | 8/2005 | Kimura ......................... 327/552 |

FOREIGN PATENT DOCUMENTS

| EP | 1294116 | 3/2003 |
| EP | 1471745 | 10/2004 |
| FR | 2898453 | 9/2007 |
| WO | WO 2006/110960 | 10/2006 |

OTHER PUBLICATIONS

Search Report Dated Sep. 11, 2008.

\* cited by examiner

*Primary Examiner* — Pao Sinkantarakorn
*Assistant Examiner* — Wei-Po Kao
(74) *Attorney, Agent, or Firm* — Robert D. Shedd; Harvey D. Fried; James McKenzie

(57) ABSTRACT

A reception device is able to receive packets in a communication network comprising at least two stations. The device is capable of receiving packets containing samples of the network which originate from data sampled every period $T_{smp}$, where $T_{smp}$ emanates from a time base synchronized on all the stations of the said network; regenerating a counting ramp with the aid of a loop receiving the samples and furthermore delivering local samples every period $T_{smp}$ and a clock. The phase-locked loop comprises: a samples comparator comparing the samples and the local samples and delivering an error signal; a corrector receiving the signal and delivering a corrected error signal, the corrector having a static gain equal to 1; a digital oscillator receiving the corrected error signal and delivering the clock, which has a frequency dependent on the signal and is proportional to a gain. According to the invention, the phase-locked loop comprises, furthermore, a gain adjustment device which determines a gain value as a function of the error signal.

6 Claims, 6 Drawing Sheets

PRECESION/SPEED COMPROMISE OF A SYNCHRONIZATION SIGNAL RECEPTION DEVICE

This application claims the benefit, under 35 U.S.C. §365 of International Application PCT/EP2008/057097, filed Jun. 6, 2008, which was published in accordance with PCT Article 21(2) on Dec. 18, 2008 in English and which claims the benefit of France patent application No. 0755689, filed Jun. 12, 2007.

FIELD OF THE INVENTION

The present invention pertains to the field of video equipment.

The present invention pertains more particularly to a device for receiving a synchronization signal on a packet switching communication network, for example of IP type (the acronym standing for the expression "Internet Protocol"), whether the network is wired (for example Ethernet (IEEE802.3)) or non-wired (for example IEEE 802.16 D-2004).

PRIOR ART

Progress in the capacity of IP networks to transport signals of any type (data or video) implies that it is possible to use such networks as a "backbone" architecture for video studios. A major benefit of this advance is that there is then a unique infrastructure for data transport. Whereas in the past, several media were required in order to transport various types of signals between equipment, the multiplexing properties offered by the IP layer make it possible to reduce the number of media required to one: an IP network which links the various items of equipment.

In the prior art, the synchronization of video equipment (cameras, etc.) in a studio is done by transmitting a synchronization signal commonly called "Genlock" or else "black burst". For example, the Genlock signal is composed of two synchronization signals; one is repeated every 40 ms and indicates the start of the video frame, the other is repeated every 64 µs (for a standard format and less for an HD format) and indicates the start of the lines in the video frame. The waveforms of the synchronization signals are dependent on the format of the image transmitted on the network. For example for a high-definition image, the synchronization signal has a form that is termed tri-level (−300 mV, 0 V, +300 mV).

When a synchronization signal is trunked to various items of equipment to be synchronized by a dedicated coaxial cable, a jitter-free constant transmission duration is ensured. On the basis of such a signal, any item of equipment is able to reconstruct a timing clock specific to its operation which guarantees that its operation is rigorously in phase with all the items of equipment linked to the same network. For example, two cameras synchronized by a Genlock signal travelling around a dedicated coaxial cable each generate a video which is of a different content but rigorously in frequency and in phase with respect to one another.

A known drawback exhibited by an IP/Ethernet network stems from the fact that it introduces strong jitter into a signals transmission and in particular for the transmission of a synchronization signal. When such a signal is trunked by an IP/Ethernet link to various items of equipment to be synchronized, this jitter results in temporal fluctuations in the duration with which the information carried by the synchronization signal reaches the equipment.

In the prior art, devices are known for reconstructing, at the level of each camera, a timing clock specific to this camera and making it possible to circumvent jitter. The principle of these devices relies on strong attenuation of the amplitude of the jitter of the synchronization signal at the reception level. It is thus possible to guarantee that an image generated by a camera is rigorously in phase with all the images generated by the neighbouring cameras linked to the same network.

Examples of such devices for attenuating jitter are described in international application PCT FR2007/050918; they act on so-called digital counting signals (or PCR, which is the acronym standing for the expression "Program Clock Reference"), which are representative of very precise reference clock signals. These digital signals are provided to cameras through a network so that they can locally reconstruct clock signals in phase with the reference clock.

The reception device according to the prior art comprises means for:
- receiving packets containing samples of the network originating from data sampled every period $T_{smp}$;
- regenerating a first counter $CSR\_PCR_1$ with the aid of a phase-locked loop $PLL_1$;
- initializing a second counter CPT every zero-crossing of the said first counter $CSR\_PCR_1$;
- generating image pips every zero-crossing of the said second counter CPT; and
- reconstituting a synchronization signal on the basis of the said image pips.

The phase-locked loop $PLL_1$ of the reception device behaves as a low-pass filter which partially attenuates the jitter present on samples received PCR, which have traveled around the network.

It is conventional to characterize a low-pass filter receiving an input signal and delivering a filtered signal by:
- a cutoff frequency $F_c$ which determines the frequency above which the input signal is attenuated,
- an order of the filter which represents an attenuation factor for the input signal for a frequency domain situated above $F_c$;
- a static gain which represents a gain (or attenuation) factor for the input signal for a frequency domain situated below $F_c$.

The higher the order of the filter, the more severe the attenuation of the input signal in a frequency domain situated above the cutoff frequency $F_c$.

Additionally, the higher the cutoff frequency $F_c$ of the filter, the higher the reaction speed of the loop $PLL_1$. On the other hand, the higher the cutoff frequency $F_c$ of the filter, the more sensitive the loop $PLL_1$ to the transient variations of the input signal.

Customarily, two phases in the operation of the loop $PLL_1$ are distinguished:
- a first phase, termed the "latching phase", during which the phase-locked loop $PLL_1$ produces in an internal manner local samples $PCR\_loc_1$ which are very different from the samples received $PCR_r$. This phase starts with a reception of samples $PCR_r$ and is completed when local samples $PCR\_loc_1$ produced by the loop $PLL_1$ are very close to the samples received $PCP_R$. During this phase of operation, a synchronization signal reconstructed receive side by means of the loop $PLL_1$ is not in phase with a send side synchronization signal;
- a second phase, termed the "tracking phase", opens at the end of the latching phase and is completed as soon as a significant deviation between the local samples $PCR\_loc_1$ and the samples received $PCR_r$ is detected. During this phase of operation, a synchronization signal reconstructed receive side is in phase with the send side synchronization signal.

To speedily obtain synchronization of items of equipment which are connected to a network, it would therefore appear to be beneficial to reduce a duration of the latching phase, that is to say it is beneficial to choose a cutoff frequency $F_c$ which is as high as possible.

Additionally, during the tracking phase, so as to preserve synchronization for as long as possible, it would appear to be beneficial to circumvent the transient variations in the samples received $PCR_r$, that is to say to have a cutoff frequency $F_c$ which is as low as possible.

A choice of a cutoff frequency value $F_c$ ensuring a compromise between the conflicting requirements which correspond to the two phases of operation is a very tricky problem. The duration with which a remote item of equipment connected to the network synchronizes with a Master item of equipment on the one hand, and the sensitivity of the synchronization to the disturbances of the input signal on the other hand are two merit criteria that are equally significant for users of equipment to be synchronized.

A solution to this problem consists in modifying the cutoff frequency $F_c$ while the reception device is operating: a high cutoff frequency $F_c$ is preferably assigned during the latching phase; a preferably low cutoff frequency $F_c$ is assigned during the tracking phase.

However, a difficulty posed by this solution stems from the fact that a complete redefinition of the parameters of the filter may require a significant duration with respect to the frequency of the input signal. This causes a delay in the transmission of a synchronization signal still in phase with a synchronization signal when sent. It is known that a phase-locked loop $PLL_1$ can be designed on the basis of VHDL codes (the acronym standing for the expression "Very High Speed Integrated Circuit Hardware Description Language"). A complete redefinition of the filter requires a large quantity of calculations to determine a series of coefficients defining the new filter. Additionally, a complete redefinition of the filter would require temporary means for storing samples because the iterative operation of the filter requires that several successive samples be available.

This difficulty can be solved by carrying out a partial modification of the parameters of the phase-locked loop $PLL_1$ used in the reception device, in particular, by modifying adapting the cutoff frequency $F_c$ of the loop $PLL_1$ according to the prevailing phase of operation of the reception device. This therefore amounts to finding a means of modifying the value of the cutoff frequency of the phase-locked loop, without modifying other parameters of the filter, as a function of the phase of operation of the reception device.

ACCOUNT OF THE INVENTION

The technical problem that the present invention proposes to solve is the modification of the cutoff frequency $F_c$ of the phase-locked loop $PLL_1$ of a reception device as a function of the prevailing phase of operation of the reception device.

For this purpose, the present invention relates to a reception device able to receive packets in a packet communication network comprising at least two stations, the said device comprising means for:
  receiving packets containing samples $PCR_r$ of the said network, the said samples $PCR_r$ originating from data sampled every period $T_{smp}$, where $T_{smp}$ emanates from a time base synchronized on all the stations of the said network;
  regenerating a counting ramp $CSR\_PCR_1$ with the aid of a phase-locked loop $PLL_1$ receiving the packets and furthermore delivering local samples $PCR\_loc_1$ every period $T_{smp}$ and a reconstituted clock $CLK\_out_1$;
  initializing, on every zero-crossing of the counting ramp $CSR\_PCR_1$, an image counter CPT which is regulated by the reconstituted clock $CLK\_out_1$;
  generating image pips every zero-crossing of the said image counter CPT; and
  reconstituting a synchronization signal on the basis of the said image pips; the phase-locked loop $PLL_1$ comprising:
  a samples comparator $COMP_1$ comparing the samples $PCR_r$ and the local samples $PCR\_loc_1$ and delivering an error signal ERR;
  a corrector $COR_1$ receiving the signal ERR and delivering a corrected error signal ERC, the corrector $COR_1$ having a static gain equal to 1;
  a digital oscillator $VCO_1$ receiving the corrected error signal ERC and delivering the reconstituted clock $CLK\_out_1$, the clock $CLK\_out_1$ having a frequency dependent on the signal ERC and being proportional to a gain G;
  characterized in that the phase-locked loop $PLL_1$ comprises, furthermore, a gain adjustment device $DAG_1$ which determines a gain value G as a function of the error signal ERR.

A first advantage of the invention resides in the capacity that it offers of achieving a compromise between the conflicting requirements of two phases of operation of the reception device: it adapts the value of the cutoff frequency $F_c$ of a phase-locked loop of the device according to the current phase of operation.

A second advantage of the invention is its ability to be compatible with prior art detection device architectures. Specifically, according to the prior art, a phase-locked loop $PLL_1$ comprises, strung together in a chain, a samples comparator, a corrector, a digital oscillator possessing a gain, a counter, and a value holding device. The invention proposes a gain adjustment device $DAG_1$ which modifies the value of the gain of the digital oscillator. According to this architecture, the oscillator delivers a reconstituted clock $CLK\_out_1$ of frequency $F_{out}$ which regulates the counter. The counter delivers a counting ramp, periodically set to 0, which is sampled by the value holding device to produce local samples $PCR\_loc_1$. In the prior art, the reconstituted clock $CLK\_out_1$ possesses a frequency $F_{out}$ which is dependent on the signal ERC and which is proportional to the gain G which is fixed.

Now, it is possible to show that if the frequency $F_{out}$ is increased, for example by increasing the gain G, this has the effect of displacing the cutoff frequency $F_c$ towards the high frequencies. Likewise it is possible to show that by decreasing the gain G, this has the effect of displacing the frequency $F_c$ towards the low frequencies. Thus, without fundamentally modifying the architecture of a prior art reception device, by acting on the value of the gain G of the controlled oscillator, the cutoff frequency $F_c$ of the phase-locked loop $PLL_1$ is rendered adaptable.

A third advantage of the invention is the simplicity of its realization. It is known that a deviation signal ERR representing the discrepancy between the samples received $PCR_r$ and the local samples $PCR\_loc_1$ is an indicator making it possible to determine which is the current phase of operation of a reception device. By reading this deviation signal ERR on a prior art reception device it is possible to modify the design of the loop $PLL_1$, for a reduced adaptation cost, and to insert therein a gain adjustment device $DAG_1$ delivering a gain value G which directly influences the cutoff frequency value $F_c$.

BRIEF DESCRIPTION OF THE DRAWINGS

The invention will be better understood with the aid of the description, given hereinafter purely by way of explanation, of an embodiment of the invention, with reference to the appended figures.

DETAILED DESCRIPTION OF THE EMBODIMENTS OF THE INVENTION

Figure 1:
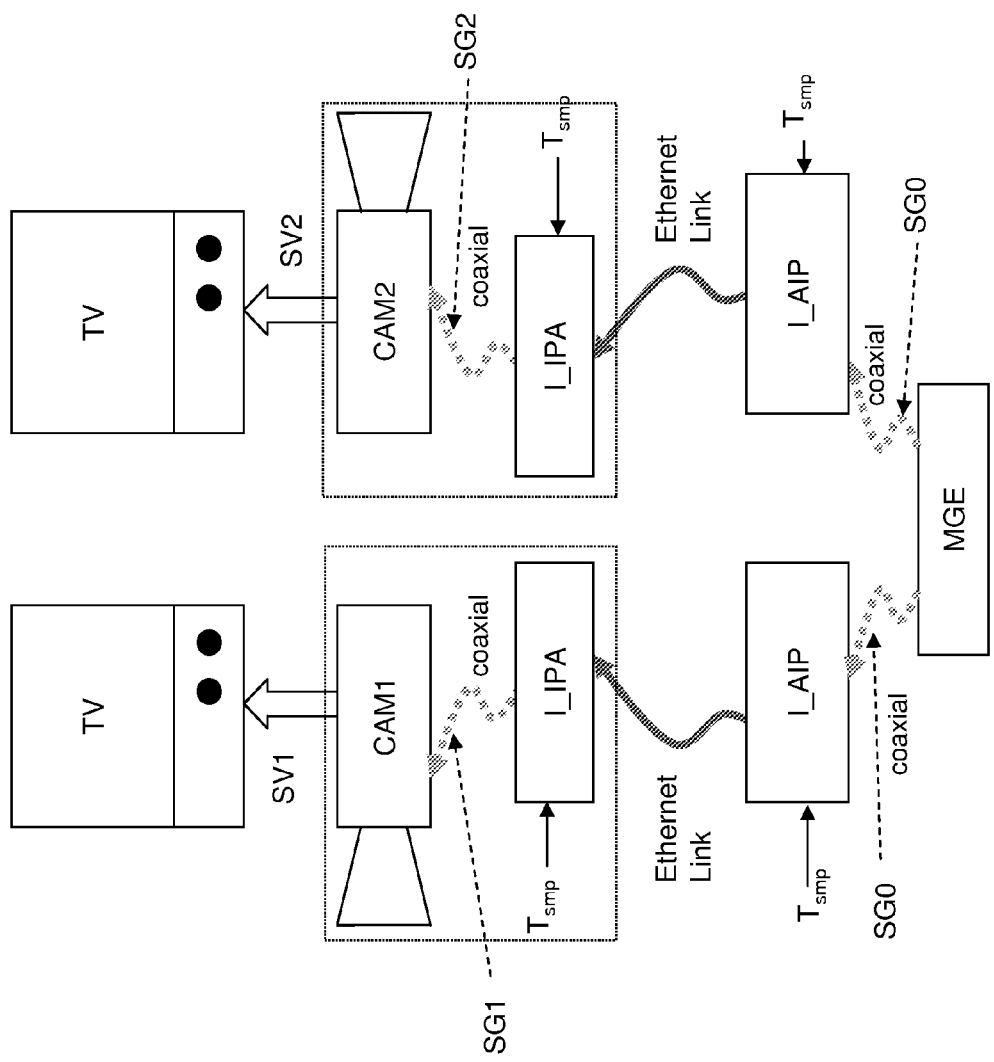
FIG. 1 illustrates the transmission of Genlock information between two cameras linked by an IP/Ethernet network.

The present analogueue world is interfaced to the IP/Ethernet network send side, and the IP/Ethernet network is interfaced to the analogueue world receive side, as is illustrated in FIG. 1.

In this same figure, the send side consists of a "Genlock Master" MGE which is connected to an Analog/IP interface I_AIP. The Genlock Master MGE produces a Genlock signal SG0 destined for the interfaces I_AIP.

The receive side consists of two cameras (CAM1, CAM2) each connected to an IP/Analog interface I_IPA. The interfaces I_IPA which will, eventually, be included in the cameras themselves have the task of reconstructing Genlock signals SG1, SG2 destined for the cameras CAM1, CAM2. The cameras CAM1, CAM2 each produce a video signal SV1, SV2 that one wishes to fully synchronize.

The send and receive sides are linked together by a packet switching network which gives rise to jitter appearing on the Genlock signal SG0.

A sampling pip, at the period $T_{smp}$, is generated on the basis of a first synchronization layer, for example IEEE1588, and is addressed to the send and receive sides. Specifically, the PTP protocol (the acronym standing for "Precision Time Protocol") based on IEEE1588 makes it possible to obtain synchronization between the items of equipment connected to an Ethernet network of the order of a microsecond. Stated otherwise, all the time bases of each item of equipment evolve at the same time to within a precision of the order of a microsecond. These time bases can be used in this case to each generate their own sampling pip at the period $T_{smp}$. The use of the IEEE1588 layer is not a compulsory route. Any system making it possible to provide sampling pips at the period $T_{smp}$ on the various items of equipment connected to a network could be suitable. It is possible for example to use a sampling pip of period 5 ms arising from a wireless transmission physical layer.

Figure 2:
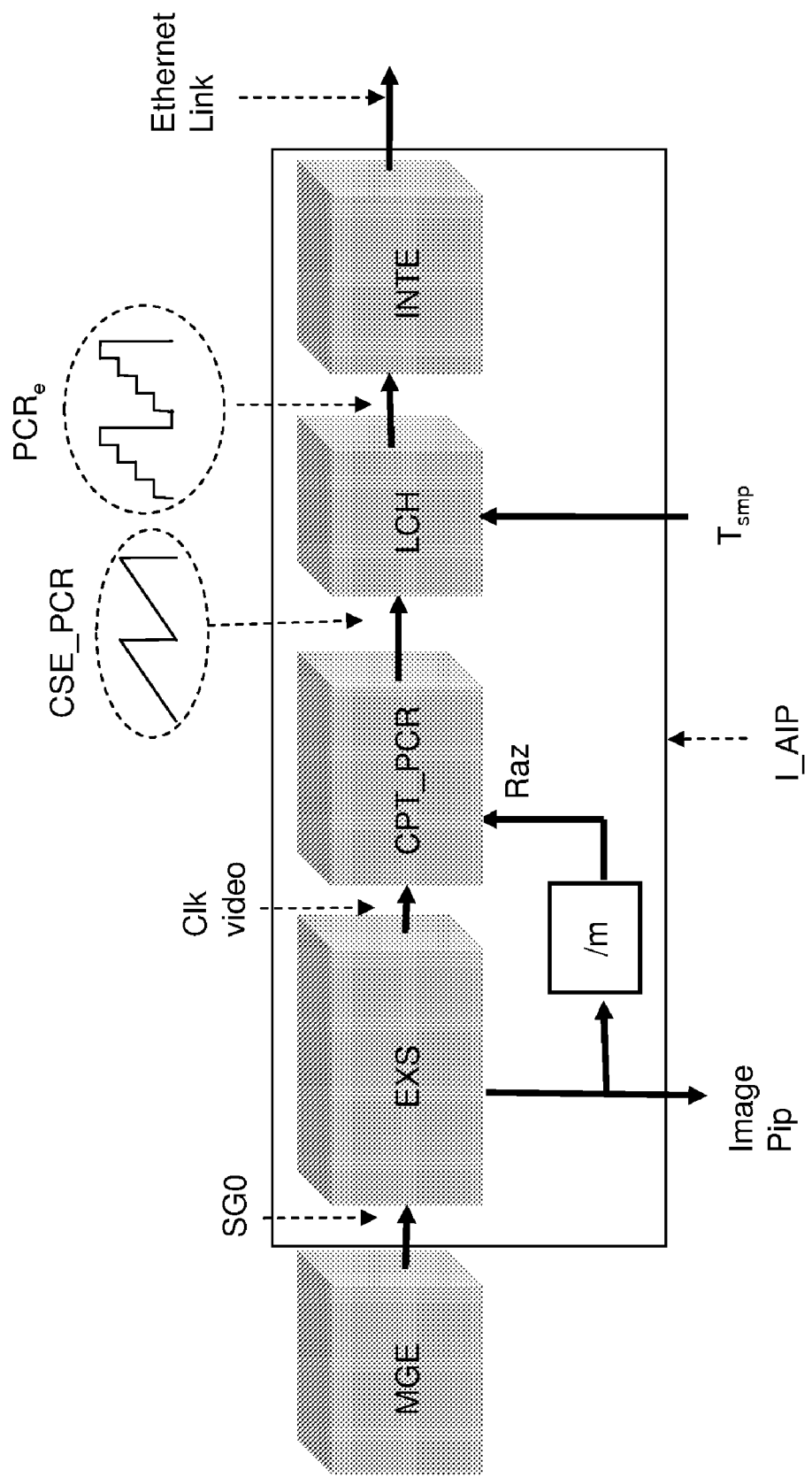
FIG. 2 illustrates the interfacing between an analogueue domain and an IP/Ethernet network.

Detailed in FIG. 2 are processings of the Genlock signal SG0 arising from MGE, within the interface I_AIP.

First of all, a module EXS extracts synchronization information for the signal SG0 so as to recover a video timing clock (denoted video Clk in FIG. 2). More precisely, the module EXS has the task of generating an image pip at each image start. Moreover, the module EXS comprises an image counter, for example a 40-ms counter, which is not represented in FIG. 2. The output of this image counter evolves according to a counting ramp passing through 0 at each image period, that is to say every 40 ms if the image counter cited as an example above is considered.

The video timing clock is employed to regulate a counter CPT_PCR. The output of the counter CPT_PCR is a counting ramp CSE_PCR, whose period equals m image periods. Every "m" images, the counter CPT_PCR is reinitialized, that is to say the counting ramp CSE_PCR is reset to 0.

Subsequently, a module LCH samples the counting ramp CSE_PCR is every period $T_{smp}$ to produce samples $PCR_e$. These samples $PCR_e$ are dispatched to the network and travel up to the receive side through an interface with network (block INTE).

Figure 3:
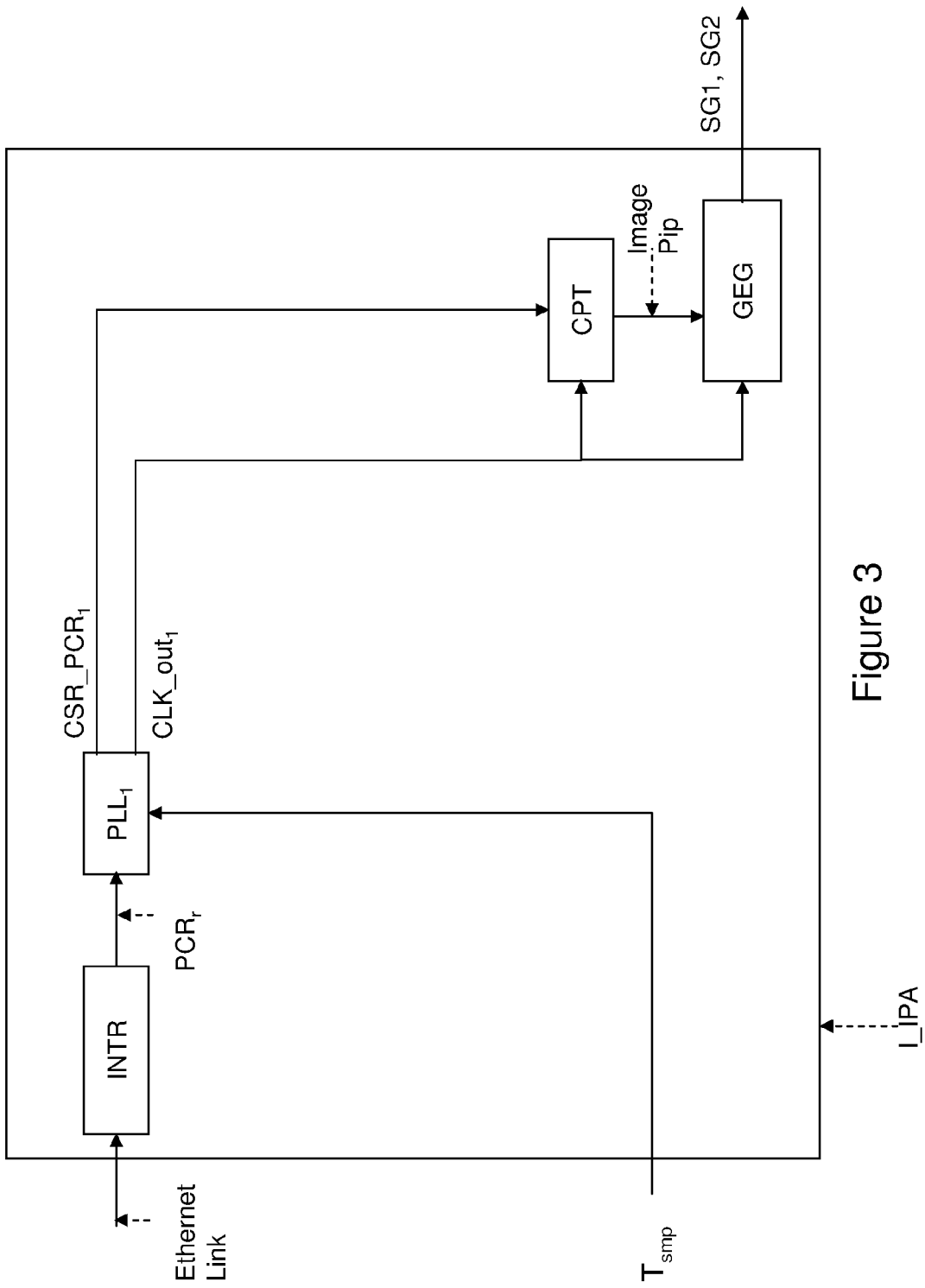
FIG. 3 illustrates the regeneration of the Genlock signal receive side according to the prior art.

FIG. 3 represents the receive side according to the prior art. The interface I_IPA recovers the samples $PCR_e$ which have been dispatched to the network. These samples $PCR_e$ are received through a network interface (module INTR) with a delay related to the transport between the sending device and the reception device: the module INTR produces samples $PCR_r$. The samples $PCR_e$, which have been produced at regular intervals $T_{smp}$ send side, reach the receive side at irregular intervals: this is due predominantly to the jitter introduced during transport over the network. The samples $PCR_r$ are taken into account at regular intervals $T_{smp}$ and, therefore, the major part of the jitter introduced during packet transport is eliminated.

The lack of precision between the send and receive sampling instants is absorbed by a phase-locked loop $PLL_1$ whose bandwidth is appropriate. The characteristics of the loop $PLL_1$ guarantee a reconstituted clock $CLK\_out_1$ generation with a reduced jitter.

The phase-locked loop $PLL_1$ behaves as a system receiving samples $PCR_r$ and delivering:
  a reconstituted clock $CLK\_out_1$,
  a counting ramp $CSR\_PCR_1$ and,
  local samples $PCR\_loc_1$.

When the loop $PLL_1$ operates in the steady state, the samples $PCR_r$ are substantially equal to the samples $PCR\_loc_1$.

The reconstituted clock $CLK\_out_1$ regulates an image counter CPT similar to the send side image counter, for example a 40-ms counter. The image counter CPT is reinitialized each time the counting ramp $CSR\_PCR_1$ crosses through 0. Between two successive initializations, the image counter CPT evolves freely and produces an image pip which supplies a local Genlock generator, GEG, to produce a reconstructed Genlock signal SG1, SG2 intended to synchronize the cameras CAM1, CAM2.

The reconstructed Genlock signal SG1, SG2, which is generated on the basis of the counting ramp $CSR\_PCR_1$ and reconstituted clock $CLK\_out_1$ is in phase with the Genlock signal SG0 on the send side, to within a clock tick.

Figure 4:
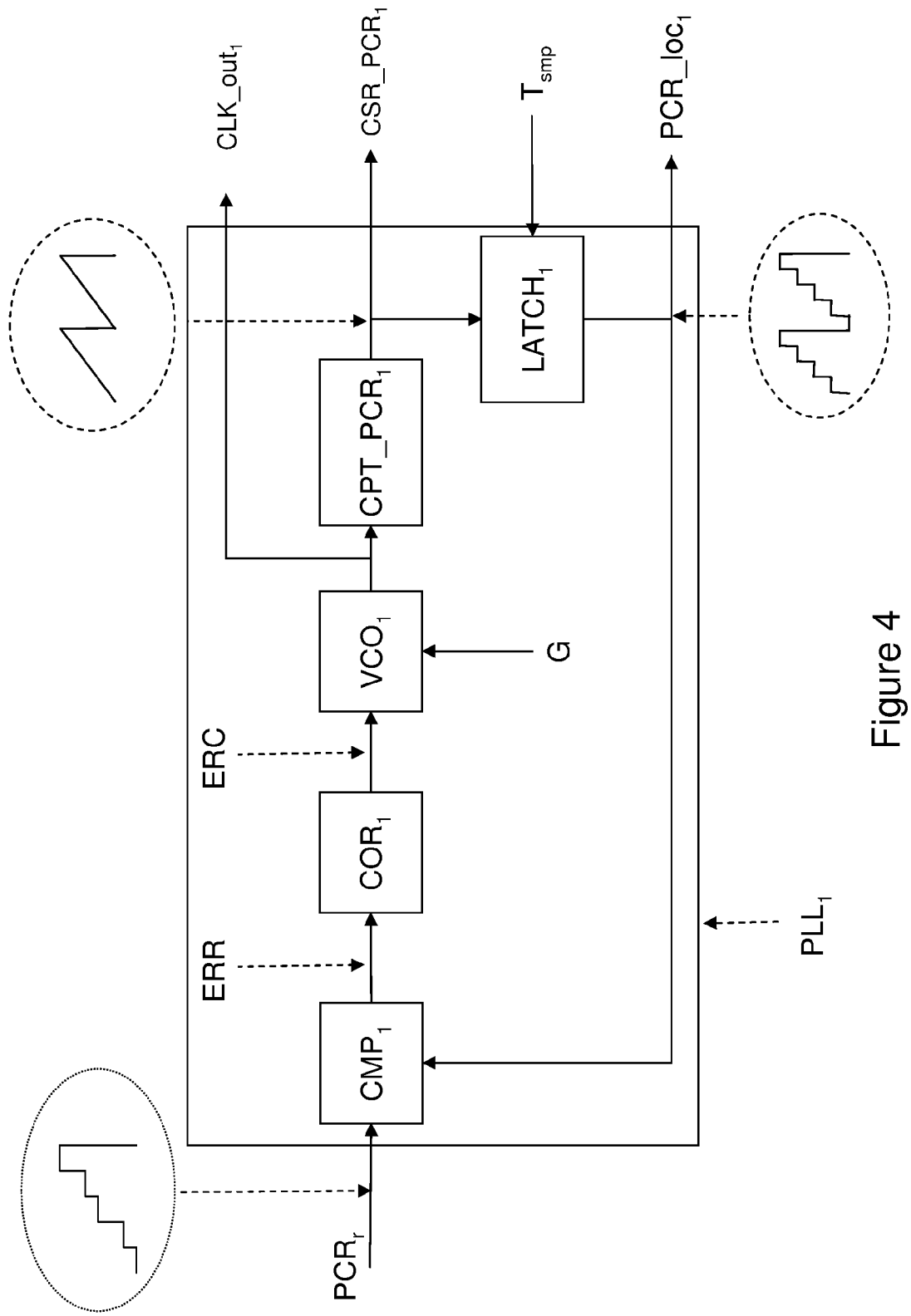
FIG. 4 schematically represents an architecture of a phase-locked loop of a reception device according to the prior art.

FIG. 4 represents an architecture of a phase-locked loop $PLL_1$ employed in an interface I_IPA according to the prior art.

Figure 5:
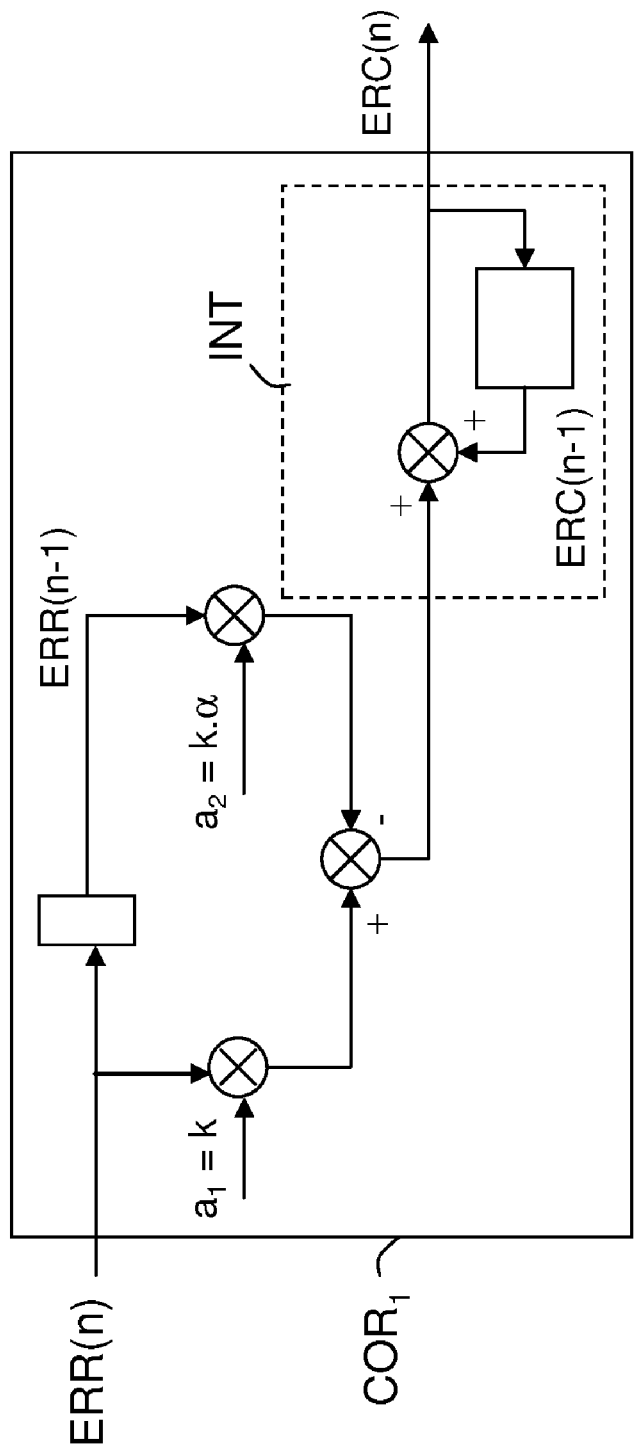
FIG. 5 illustrates in a very schematic and functional manner an exemplary embodiment of a corrector of a phase-locked loop according to the prior art.

As represented in FIG. 4, the phase-locked loop $PLL_1$ comprises:
  a samples comparator $CMP_1$ which compares the samples PCR, and local samples and delivering a samples comparison result, or an error signal ERR;
  a corrector $COR_1$ receiving the signal ERR and delivering a corrected error signal ERC, the corrector $CORR_1$ having a static gain equal to 1;

a digital oscillator $VCO_1$ receiving the corrected error signal ERC and delivering a reconstituted clock $CLK\_out_1$, the clock $CLK\_out_1$ has a frequency which depends on the signal ERC and which is proportional to a fixed gain G;

a counter $CPT\_PCR_1$ which produces a counting ramp $CSR\_PCR_1$ according to a timing regulated by the reconstituted clock $CLK\_out_1$, a value holding system $LATCH_1$, which generates local samples $PCR\_loc_1$ on the basis of the values of the counting ramp $CSR\_PCR_1$ at the instants $T_{smp}$;

A nonlimiting exemplary embodiment of the corrector $COR_1$ is schematically illustrated in FIG. 5. The corrector $COR_1$ illustrated makes it possible to have a loop $PLL_1$ whose impulse response is that of a second order. It implements a so-called Zdan procedure (but other procedures known to the person skilled in the art may be implemented). This type of corrector $COR_1$ makes it possible to have a zero speed error within the slaving sense.

The references a1 and a2 of the corrector $COR_1$ designate coefficients whose values are chosen to obtain a chosen damping coefficient. For example, a1=1250370 and a2=1247598. The reference INT designates an integration module tasked with determining a configuration value ERC (n), or corrected error signal, which must be used by the digital clock $VCO_1$ for the sampling period $T_{smp}(n)$ considered. This integration module INT guarantees a zero speed error.

ERR(n) designates the comparison signal, or error signal, which has just been determined by the comparison module $CMP_1$ for the sampling period $T_{smp}(n)$ in progress.

ERR(n−1) designates the comparison signal, or error signal, which has been determined by the comparator $CMP_1$ during the previous sampling period $T_{smp}(n-1)$.

Thus, in this example, the loop $PLL_1$ ensures a filtering which can be modelled as a low-pass filter of order 2. The order of the filter is defined by the architecture of the corrector $COR_1$.

The static gain of the filter is defined by the static gain of the corrector; it is generally chosen equal to one.

The gain G of the digital oscillator $VCO_1$ defines the cutoff frequency $F_c$ of the filter.

A complete redefinition of the filter consisting of the loop $PLL_1$ requires on the one hand a determination of the coefficients a1, a2 but also temporary storage means for preserving the comparison signal ERR(n−1) of the previous sampling period $T_{smp}(n-1)$. Indeed, without these storage means, the redefinition of the filter would cause an interruption of transmission which would run counter to what is sought: a reduction in the duration of the latching phase. These storage means represent substantial modifications of the design of the prior art reception devices.

The reconciliation of constraints tied on the one hand to the reducing of the duration of the latching phase and on the other hand to the decreasing of the sensitivity of the loop $PLL_1$ during the tracking phase is solved by adapting the gain value G used by the digital oscillator as a function of information indicating which is the current phase of operation. The major constraint for this to be achievable is that this adaptation has no effects on the other parameters of the corrector $COR_1$ (static gain, and order of the filter).

The technical problem posed to the person skilled in the art is that consisting in adapting the gain value of the digital oscillator as a function of the current phase of operation of the phase-locked loop without modifying the other parameters of the loop.

Figure 6:
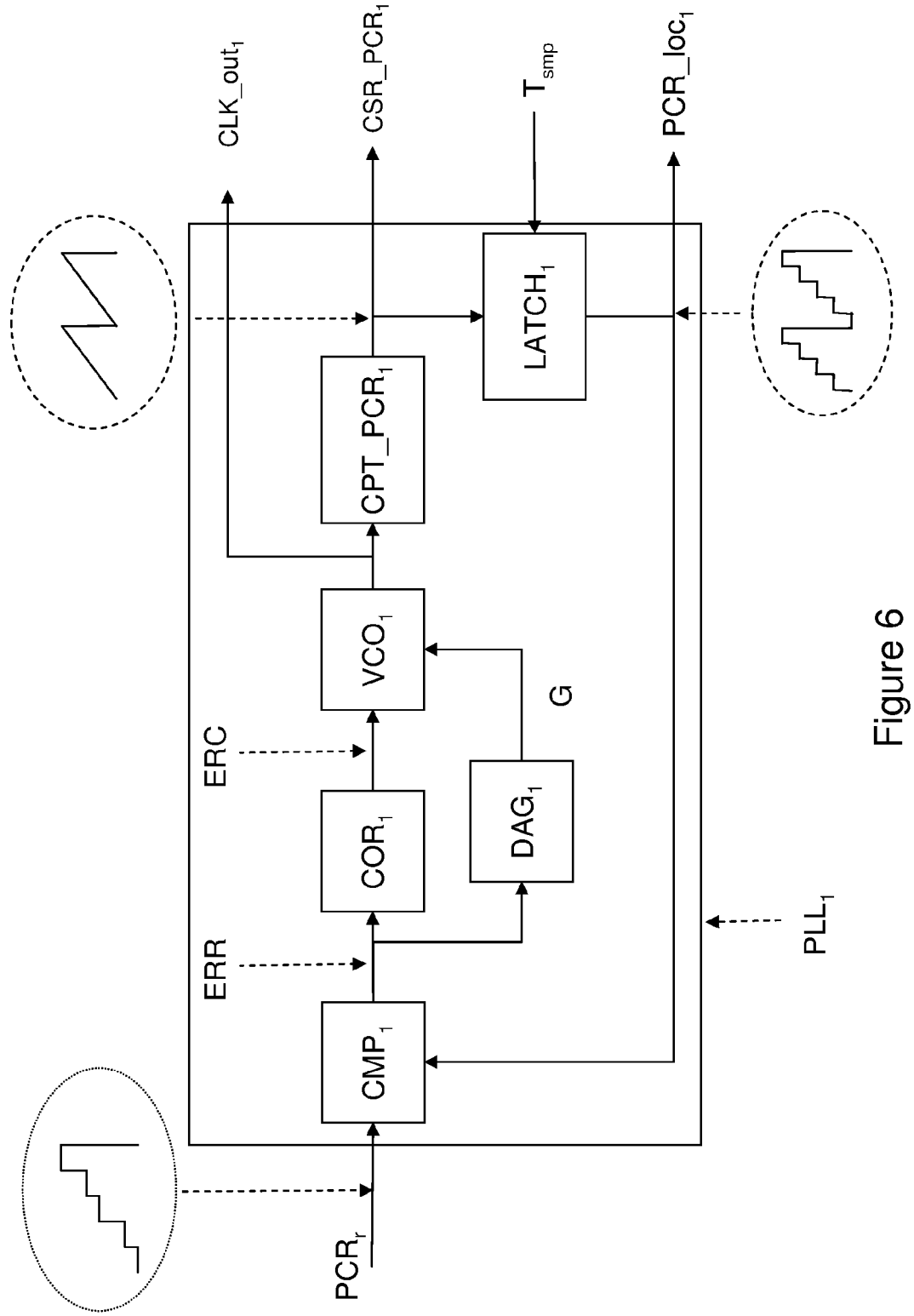
FIG. 6 schematically represents an architecture of a phase-locked loop of a reception device according to the invention.

FIG. 6 illustrates a phase loop of a reception device according to the invention.

According to the invention, the loop $PLL_1$ comprises a gain adjustment device $DAG_1$ which determines a gain value G as a function of the error signal ERR.

Advantageously, the gain value G delivered by the device $DAG_1$ lies between a gain value $G_{min}$ and a gain value $G_{Max}$.

To circumvent the fast variations of the samples received $PCP_R$, which could trigger inopportune tracking phase exit, it may be beneficial to consider, rather than the value of the error signal, a mean value <ERR>> of the error signal ERR over a duration $T_M$. The mean value <ERR> can be calculated by an integration module integrated into the gain adjustment device $DAG_1$.

Advantageously, the gain value G delivered by the device $DAG_1$ is determined as a function of a mean value <ERR> of the error signal ERR over a duration $T_M$.

Usually, the frequency $F_{out}$ of the reconstituted clock is an increasing function of the amplitude of the error signal ERR and of the gain G of the digital oscillator $VCO_1$.

Advantageously, the function determining the gain value G in accordance with the mean value <ERR> is an increasing function.

One seeks to limit the number of calculations with the objective of reducing the response time of the reception device according to the invention. With this aim, the function determining the gain value G in accordance with the mean value <ERR> requires low calculation power.

Advantageously, the function determining the gain value G in accordance with the mean value <ERR> is a piecewise linear function.

The invention claimed is:

1. Reception device able to receive packets in a packet communication network comprising at least two stations, the said device comprising:
    means for receiving packets containing samples of the said network, the said samples originating from data sampled every period $T_{smp}$, where $T_{smp}$ emanates from a time base synchronized on all the stations of the said network;
    means for regenerating a counting ramp with the aid of a phase-locked loop receiving the samples and furthermore delivering local samples every period $T_{smp}$ and a reconstituted clock;
    means for initializing, on every zero-crossing of the counting ramp, an image counter which is regulated by the reconstituted clock;
    means for generating image pips every zero-crossing of the said image counter; and
    means for reconstituting a synchronization signal on the basis of the said image pips;
    the phase-locked loop comprising:
    a samples comparator comparing the samples and the local samples and delivering an error signal;
    a corrector receiving the error signal and delivering a corrected error signal, the corrector having a static gain equal to 1;
    a digital oscillator receiving the corrected error signal and delivering the reconstituted clock, the clock having a frequency dependent on the corrected error signal and being proportional to a gain;
    wherein the phase-locked loop comprises, furthermore, a gain adjustment device which determines a gain value as a function of the error signal for modification of a cutoff frequency wherein the gain adjustment device modifies the cutoff frequency of the phase-locked loop based on whether the reception device is in a latching phase or a tracking phase.

2. Reception device according to claim 1, wherein the gain value delivered by the device lies between a lower bound $G_{Min}$ and an upper bound $G_{Max}$.

3. Reception device according to claim 1, wherein the gain value delivered by the device is determined as a function of a mean value of the error signal over a duration $T_M$.

4. Reception device according to claim 3, wherein the function determining the gain value in accordance with the mean value is an increasing function.

5. Reception device according to claim 3, wherein the function determining the gain value in accordance with the mean value is a piecewise linear function.

6. Reception device according to claim 1, wherein the error signal indicates a current phase of the reception device.

\* \* \* \* \*